United States Patent
Furuya

(10) Patent No.: US 8,679,253 B2
(45) Date of Patent: Mar. 25, 2014

(54) DEPOSITION APPARATUS AND METHOD FOR DEPOSITING FILM

(75) Inventor: Akira Furuya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1600 days.

(21) Appl. No.: 11/704,295

(22) Filed: Feb. 9, 2007

(65) Prior Publication Data

US 2007/0186849 A1   Aug. 16, 2007

(30) Foreign Application Priority Data

Feb. 13, 2006 (JP) ................................. 2006-035243

(51) Int. Cl.
C23C 16/00 (2006.01)
C23C 16/455 (2006.01)
C23C 16/52 (2006.01)

(52) U.S. Cl.
USPC ..................................... 118/715; 156/345.29

(58) Field of Classification Search
USPC ............ 118/715; 156/345.29, 345.33, 345.34
See application file for complete search history.

(56) References Cited

U.S. PATENT DOCUMENTS

| | | | | |
|---|---|---|---|---|
| 5,070,814 A | * | 12/1991 | Whiffin et al. | 118/715 |
| 5,830,807 A | * | 11/1998 | Matsunaga et al. | 438/714 |
| 5,866,198 A | * | 2/1999 | Sato et al. | 427/124 |
| 6,503,330 B1 | * | 1/2003 | Sneh et al. | 118/715 |
| 6,540,838 B2 | * | 4/2003 | Sneh et al. | 118/715 |
| 6,786,936 B2 | * | 9/2004 | Vaartstra | 29/25.01 |
| 6,915,592 B2 | * | 7/2005 | Guenther | 34/582 |
| 7,294,208 B2 | * | 11/2007 | Guenther | 118/715 |
| 7,481,902 B2 | * | 1/2009 | Shinriki et al. | 156/345.29 |
| 2002/0108570 A1 | * | 8/2002 | Lindfors | 118/715 |
| 2003/0000471 A1 | * | 1/2003 | Yoon et al. | 118/715 |
| 2003/0064556 A1 | * | 4/2003 | Krishnaraj et al. | 438/200 |
| 2003/0159653 A1 | * | 8/2003 | Dando et al. | 118/715 |

(Continued)

FOREIGN PATENT DOCUMENTS

| | | |
|---|---|---|
| JP | 62-22420 | 1/1987 |
| JP | 4-361531 | 12/1992 |

(Continued)

OTHER PUBLICATIONS

Notice of Reasons for Rejection mailed Feb. 28, 2012 by the Japanese Patent Office in counterpart Japanese Application No. 2006-035243, w/English translation, 7 pages.

*Primary Examiner* — Jeffrie R Lund
(74) *Attorney, Agent, or Firm* — Young & Thompson

(57) ABSTRACT

An enhanced utilization efficiency of gases can be presented and an improved deposition characteristics are presented, when a film is deposited with a plurality of gases. A deposition apparatus 100 includes: a reaction chamber 102 for depositing a film; a first gas supply line 112 and a second gas supply line 152 for supplying a first source material A and a gas B to a reaction chamber 102, respectively; and an exciting unit 106 that is capable of exciting a gas supplied in the reaction chamber 102 to form a plasma. In the deposition apparatus 100 having such configuration, a deposition operation is performed by: a first operation for supplying a gas derived from a first source material A and a gas B in the reaction chamber 102 to cause the gas derived from a first source material A adsorbed on the substrate, thereby forming a deposition layer; and a second operation for supplying a second gas in reaction chamber 102, and treating the deposition layer with the gas in a condition of being plasma-excited.

10 Claims, 8 Drawing Sheets

(56) References Cited

U.S. PATENT DOCUMENTS

| | | | |
|---|---|---|---|
| 2003/0207032 A1* | 11/2003 | Ahn et al. | 427/255.34 |
| 2005/0223982 A1* | 10/2005 | Park et al. | 118/715 |
| 2005/0241763 A1* | 11/2005 | Huang et al. | 156/345.33 |
| 2006/0110533 A1* | 5/2006 | Hwang et al. | 427/248.1 |
| 2006/0110534 A1* | 5/2006 | Hwang et al. | 427/248.1 |
| 2006/0154383 A1* | 7/2006 | Kannan et al. | 438/5 |
| 2007/0042508 A1* | 2/2007 | Shajii et al. | 438/5 |
| 2007/0186849 A1* | 8/2007 | Furuya | 118/715 |
| 2007/0186972 A1* | 8/2007 | Kobayashi et al. | 137/15.01 |
| 2007/0269596 A1* | 11/2007 | Shero et al. | 427/248.1 |
| 2009/0314369 A1* | 12/2009 | Pozniak | 137/861 |

FOREIGN PATENT DOCUMENTS

| | | |
|---|---|---|
| JP | 10-284487 | 10/1998 |
| JP | 2003-041367 | 2/2003 |
| JP | 2005-203569 | 7/2005 |
| JP | 2005-229129 | 8/2005 |
| WO | 03/089683 | 4/2003 |

* cited by examiner

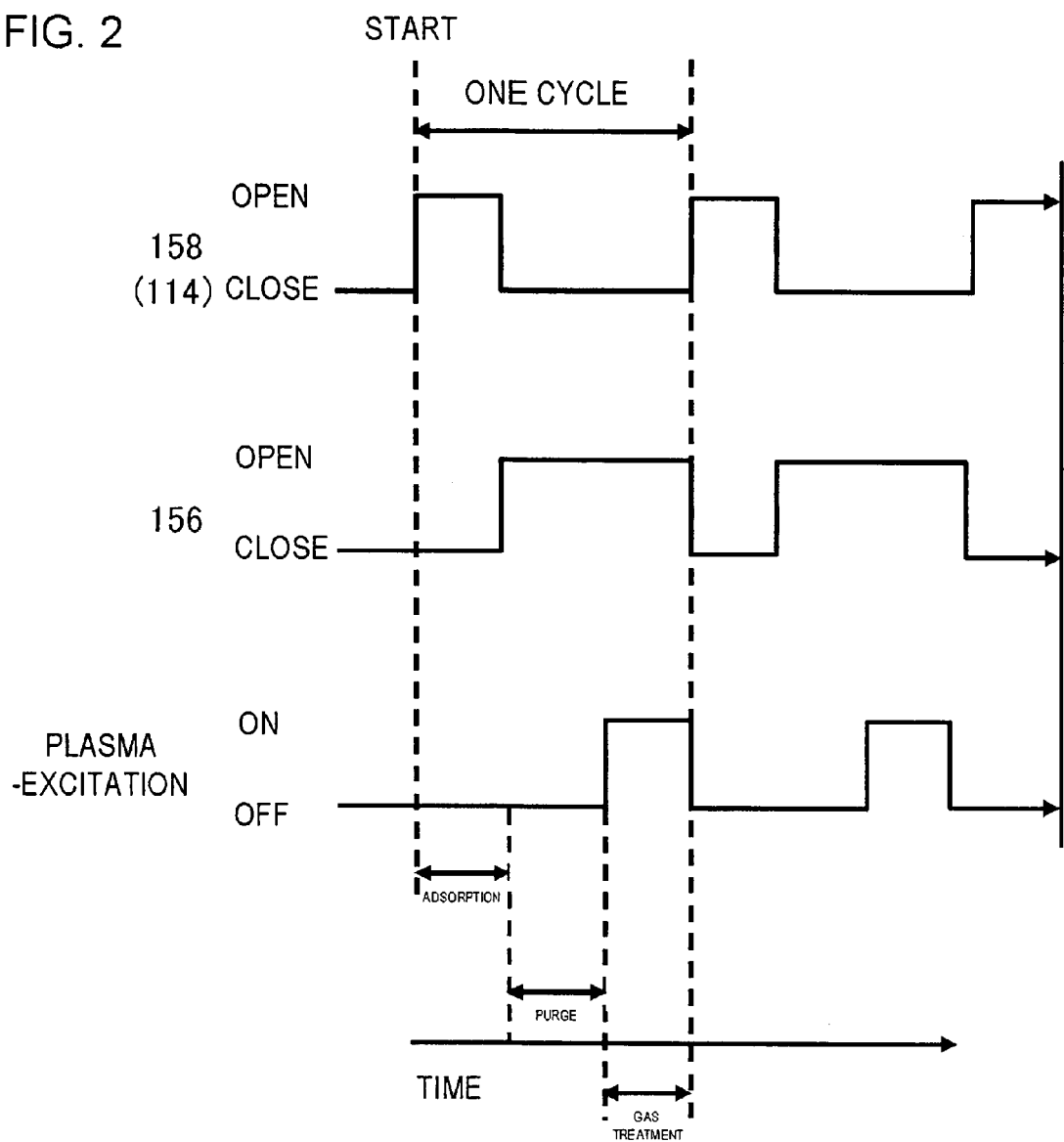

DEPOSITION APPARATUS AND METHOD FOR DEPOSITING FILM

This application is based on Japanese patent application No. 2006-35,243, the content of which is incorporated hereinto by reference.

BACKGROUND

1. Technical Field

The present invention relates to a deposition apparatus and method for depositing a film.

2. Related Art

In semiconductor devices of recent years, a delay in signal propagation through an interconnect restricts an operating speed of electronic elements. A delay constant in signal propagation through an interconnect is represented by a product of an interconnect resistance and an interconnect capacitance. Therefore, in order to achieve faster operation of elements, a low dielectric constant material having lower dielectric constant than a conventional silicon dioxide film ($SiO_2$) is employed for an interlayer insulating film, and copper (Cu) having lower resistivity is employed for an interconnect.

A multiple-layered interconnect employing copper as an interconnect material is formed by a damascene process. In typical damascene process, a concave portion such as an interconnect trench or a via hole is formed in an interlayer insulating film, and then a barrier metal film is deposited in the concave portion, and the concave portion is further plugged with a copper film, and thereafter, portions of the copper film and the barrier metal film deposited outside of the concave portion are removed by a chemical mechanical polishing (CMP) process to obtain a copper interconnect or a copper via.

In such copper interconnect or copper via, a barrier metal film is composed of, for example, a titanium nitride (TiN) film. A resistivity of such barrier metal film is higher than copper by several-folds to several tens-folds. Therefore, as the interconnect dimension is decreased, the film thickness of the barrier metal film should also be reduced, and otherwise, a contribution of the barrier metal in the interconnect is increased, leading to unwanted increase in the interconnect resistance. Consequently, a reduction of the film thickness of the barrier metal film is particularly critical in the post-45 nm technology node. Meanwhile, the barrier metal film is required to have a certain level of film thickness, in order to maintain a barrier-ability against a diffusion of copper and/or an adhesiveness between the copper film and the interlayer insulating film. To meet these demands, higher step coverage and higher deposition uniformity across the wafer surface are required in the process for depositing the barrier metal film. Therefore, developments in an atomic layer deposition (ALD) process, which can achieve higher step coverage and higher deposition uniformity across the wafer surface, is proceeded.

Japanese Laid-open patent publication No. 2005-229,129 discloses an ALD process employing a plasma (plasma enhanced ALD, PEALD). In such process, a plasma-processing is carried out in every cycle of supplying a reactive gas or after several cycles of supplying a reactive gas are repeated to form a titanium nitride (TiN) film or the like.

Japanese Laid-open patent publication No. 2005-203,569 discloses a method for manufacturing a semiconductor device includes: a first operation for forming a first barrier metal thin film on a substrate by employing a first gas and a second gas for inducing a reduction of the first gas; and a second operation for forming a second barrier metal thin film on the first barrier metal thin film formed by the first operation for forming the first barrier metal thin film by employing a third gas and a fourth gas for inducing a reduction of the third gas without exposing the substrate in an atmospheric air. A procedure for exposing the substrate to plasma atmosphere of the fourth gas in the second operation for forming the barrier metal thin film is disclosed.

Japanese domestic re-publication of PCT international application No. 2005-523,580 discloses a remote plasma ALD apparatus, which comprise: a reaction chamber; an exhaust line for exhausting a gas from the reaction chamber; a first reactive gas supplying unit for selectively supplying the first reactive gas to the reaction chamber or the exhaust line; a first reactive gas transfer line that connects the reaction chamber with the first reactive gas supplying unit; a first bypass line that connects the exhaust line with the first reactive gas supplying unit; a radical supplying unit for generating radical and for selectively supplying such radical to the reaction chamber or the exhaust line; a radical transfer line that connects the reaction chamber with the radical supplying unit; a second bypass line that connects the exhaust line with the radical supplying unit; and main purge gas supplying unit for supplying main purge gas to the first reactive gas transfer line and/or a radical transfer line.

Japanese Laid-open patent publication No. 2003-41,367 discloses a substrate processing apparatus, in which, when a combination of a gas with a need for being excited and a gas without a need for being excited is flown in a common supplying system disposed in a downstream of an excitation unit, the gas without a need for being excited can be appropriately supplied into a reaction chamber in a condition of being not excited. Japanese Laid-open patent publication No. H10-284, 487 (1998) discloses a process for depositing a Si—O—F insulating layer on a substrate within a chemical vapor deposition (CVD) processing chamber. A system dedicated for implementing such process comprises: a vacuum chamber; a gas distribution system, which is capable of introducing a gaseous mixture containing dissociated silicon tetrafluoride ($SiF_4$) radical and an oxygen-containing gas into the vacuum chamber, where an Si—F—O film is deposited on a wafer by a thermal reaction of the introduced process gas; and an excitation chamber for dissociating $SiF_4$ gas to create $SiF_4$ radical, disposed remote from the vacuum chamber and connected to the gas distribution system.

In the mean time, in deposition apparatus such as ALD apparatus, a flow rate of a source gas supplied in a reaction chamber is controlled by a mass flow controller (MFC). On the other hand, an ALD deposition generally requires frequently supplying a source material with shorter intervals than the opening and closing operation by the MFC for providing an improved throughput. Consequently, a valve is provided between the MFC and the reaction chamber, and an operation for controlling a supply of a source gas is performed by opening and closing the valve while the MFC is kept open in the deposition process (see Japanese domestic re-publication of PCT international application No. 2005-523,580 and Japanese Laid-open patent publication No. 2003-41,367).

However, such operation causes an increased pressure between the MFC and the valve, as compared with a pressure in supplying the source gas, while the valve is closed so that the source gas is not supplied in the reaction chamber. In consequence of such phenomenon, the pressure in the reaction chamber becomes higher right after the valve is opened, leading to larger flow rate of the supplied source gas, and then the flow rate of the supplied source gas is decreased. Such change in the rate of the supplied source material adversely affects the deposition characteristics, and causes deterioration in the deposition uniformity across the wafer surface. In particular, in the PEALD process as illustrated in Japanese Laid-open patent publication No. 2005-229,129, Japanese Laid-open patent publication No. 2005-203,569 and Japanese Laid-open patent publication No. 2003-41,367, the rate of the supplied gas employed for a plasma-processing is influential in purity of the deposited film. Therefore, a flow rate of the gas for a plasma-processing is often selected to be larger than flow rates of other gases. Consequently, a fluctuation in the pressure of the gas for a plasma-processing is more critical issue in the PEALD process, as compared with ALD processes without plasma. Nevertheless, a consideration for such pressure fluctuation is not included in the technologies disclosed in Japanese Laid-open patent publication No. 2005-229,129, Japanese Laid-open patent publication No. 2005-203,569 and Japanese Laid-open patent publication No. 2003-41,367.

In addition, another issue related to the ALD process is that an use of multiple types of gases inevitably causes a complicated duct configuration. In the technology described in Japanese Laid-open patent publication No. H10-284,487, the duct system is to be simplified by utilizing a gas mixing chamber to constitute a duct for connecting from the gas mixing chamber to the reaction chamber with a single duct. However, gases are simultaneously supplied in such configuration, and therefore there is a problem that the ALD deposition process cannot be performed by such configuration. In addition, the above-described issues of a pressure fluctuation can not be avoided even if such technology is employed.

The configuration as disclosed in Japanese domestic re-publication of PCT international application No. 2005-523,580 can allow a gas flowing into a reaction chamber or an exhaust line on a steady basis. Having this configuration, a change in the pressure between the MFC and the valve, which is the above-mentioned problem, can be reduced. However, such process causes a discharge of the unconsumed source material, leading to an increased consumption of the source material. Further, when the configuration as described in Japanese domestic re-publication of PCT international application No. 2005-523,580, in which two types of reactive source gases are simultaneously and directly exhausted via the exhaust line without passing through the deposition chamber, is employed, it is possible that the source materials are reacted within the exhaust line and the line is clogged. If such problem is to be avoided, another problem of having a complicated apparatus configuration, which is caused by having separated ducts and/or arrangements for avoiding the difficulties, is caused.

SUMMARY OF THE INVENTION

According to one aspect of the present invention, there is provided a deposition apparatus, comprising: a reaction chamber for conducting a deposition process; a gas supplying system for supplying a first gas and a second gas into the reaction chamber; a switching unit for switching between a supply of the first gas to the reaction chamber in a first step in which the first gas and the second gas are supplied into the reaction chamber and a stopping of the supply of the first gas to the reaction chamber in a second step in which the second gas is selectively supplied into the reaction chamber; an exciting unit for exciting a gas being supplied into the reaction chamber to create a plasma; and a controller unit capable of controlling the exciting unit, so that an excitation of the gas into a plasma is not performed by the exciting unit during the first step in which the first gas is adsorbed on the substrate to form a deposition layer and an excitation of the gas into a plasma is performed by the exciting unit during the second step in which the second gas, with being excited into a plasma, treats the deposition layer.

This can achieve a supply of the second gas into the reaction chamber when the first gas is adsorbed on the substrate, thereby achieving a continuous supply of the second gas into the reaction chamber. Having this configuration, a constant pressure of the second gas in the gas supplying system can be maintained, thereby maintaining a constant flow rate of the supplied gas. Therefore, an improved deposition characteristics can be presented.

Further, according to the above-described aspect of the present invention, the second gas is continually supplied into the reaction chamber, and simultaneous exhaust of the first gas and the second gas directly to the exhaust line is avoided. Therefore, a clogging of the exhaust line due to a reaction of these gases in the exhaust line can be prevented. Further, the supply of the first gas is stopped when the second gas is excited, and thus a plasma excitation is not performed for a gaseous mixture of the first gas and the second gas. Therefore, a deposition of a film by reacting these gases in a duct or the like is avoided. In addition to above, the exciting unit may be provided in vicinity of the reaction chamber. This configuration provides maintaining larger amount of gases in an excited state in the reaction chamber.

In the deposition apparatus of the present invention, the aforementioned gas supplying system may be further capable of supplying a third gas into the aforementioned reaction chamber, and the aforementioned switching unit may be capable of switching between a supply of and a stopping of the supply of the aforementioned third gas into the aforementioned reaction chamber, and may be also capable of stopping the supply of the aforementioned third gas in the aforementioned second stage. Further, the controller unit may be designed so that a plasma excitation of the aforementioned exciting unit is not performed during a third stage, in which the aforementioned third gas and the aforementioned second gas are supplied into the reaction chamber and the aforementioned third gas is adsorbed on the substrate to form a deposition layer.

As described above, the deposition apparatus of the present invention may be further configured to be capable of depositing a film by employing further multiple types of gases. Here, the third gas may be composed of a material selected from a group that is the same as the group of materials for the first gas.

In the deposition apparatus of the present invention, the aforementioned gas supplying system may include: a first supply line, being connected to the aforementioned reaction chamber, and supplying the aforementioned first gas in the aforementioned reaction chamber; and a second supply line including a first line which is connected to the aforementioned reaction chamber for supplying the aforementioned second gas into the aforementioned reaction chamber and a second line branched from the first line and connected to the aforementioned first supply line. Further, the switching unit may include a first switching unit and a second switching unit, the first switching unit being capable of supplying the second gas to the second line in the first stage and of supplying the first gas to the first line in the second stage, the second switching unit being capable of supplying the first gas into the reaction chamber in the first stage, and capable of stopping the supply of the first gas into the reaction chamber in the second stage. The first switching units are provided in the first line and in the second line, respectively, and may be configured to be a pair of switching valves that are capable of complementary opening and closing. Alternatively, the first switching unit may be a three-way valve provided in a branching-off point of the first line and the second line.

This can provide a continuous supply of the second gas into the reaction chamber through either the first line or the second line. Having this configuration, a constant pressure of the second gas in the gas supplying system can be maintained, thereby maintaining a constant flow rate of the supplied gas. Therefore, an improved deposition characteristics can be presented. Further, since the gaseous mixture of the first gas and the second gas is introduced into the reaction chamber through a passage other than the passage where a plasma excitation is performed, a deposition of a film by a reaction of the gas in the duct or the like is avoided.

According to another aspect of the present invention, there is provided a deposition apparatus, comprising: a reaction chamber for conducting a deposition process; a first supply line being connected to the reaction chamber for supplying a first gas into the reaction chamber; a second supply line including a first line connected to the reaction chamber for supplying a second gas into the reaction chamber and a second line branched from the first line and connected to the first supply line; a switching unit, being capable of switching between a first step and a second step, wherein, in the first step, the second gas is supplied to the second line and eventually supplied into the reaction chamber with the first gas, and wherein, in the second step, the supply of the first gas is stopped and the second gas is selectively supplied to the first line; and an exciting unit for exciting the gas supplied from the first line of the second supply line into a plasma.

This can provide a continuous supply of the second gas into the reaction chamber through either the first line or the second line. Having this configuration, a constant pressure of the second gas supplied into the reaction chamber can be maintained, thereby maintaining a constant flow rate of the supplied gas. Therefore, an improved deposition characteristics can be presented. Further, according to the above-described aspect of the present invention, the second gas is continually supplied into the reaction chamber, and simultaneous exhaust of the first gas and the second gas directly to the exhaust line is avoided. Therefore, a clogging of the exhaust line due to a reaction of these gases in the exhaust line can be prevented. Further, since the gaseous mixture of the first gas and the second gas is introduced into the reaction chamber through a passage other than the passage where a plasma excitation is performed, a deposition of a film by a reaction of the gas in the duct or the like is avoided.

The deposition apparatus of the present invention may further comprise a controller unit, which is capable of adsorbing the first gas onto the substrate without conducting a plasma excitation by the exciting unit during the first stage, and capable of plasma-exciting the second gas by the exciting unit during the second stage.

According to further aspect of the present invention, there is provided a method for depositing a film, comprising: forming a deposition layer by supplying the first gas and the second gas into the reaction chamber and adsorbing the first gas on a substrate; and treating the deposition layer with a plasma created by supplying the second gas into the reaction chamber and exciting the gas.

In the aforementioned forming the deposition layer, the second gas may be employed as a carrier gas for the first gas. In the aforementioned forming the deposition layer, the deposition layer can be formed by adsorbing the first gas under a condition without an excitation of the first gas and the second gas.

This can provide a supply of the second gas into the reaction chamber when the first gas is adsorbed on the substrate, and therefore the second gas can be continually supplied in reaction chamber. Having this configuration, a constant pressure of the second gas supplied into the reaction chamber can be maintained, thereby maintaining a constant flow rate of the supplied gas. Therefore, an improved deposition characteristics can be presented.

Further, since simultaneous exhaust of the first gas and the second gas directly to the exhaust line is avoided according to the above-described aspect of the present invention, a clogging of the exhaust line due to a reaction of these gases in the exhaust line can be prevented. Further, since a plasma excitation for a gaseous mixture of the first gas and the second gas is not performed, a deposition of a film by a reaction of the gas in the duct or the like is avoided. In addition, larger amount of gases can be contained in an excited state in the reaction chamber by disposing the plasma exciting unit in a location closer to the reaction chamber than a converging point of gases.

According to the present invention, an enhanced utilization efficiency of gases can be presented and an improved deposition characteristics can be presented, when a film is deposited with a plurality of gases.

BRIEF DESCRIPTION OF THE DRAWINGS

The above and other objects, advantages and features of the present invention will be more apparent from the following description taken in conjunction with the accompanying drawings, in which:

FIG. 2 is a timing chart, indicating a controlling timing for the deposition apparatus in the embodiment of the present invention;

DETAILED DESCRIPTION

Figure 1A:
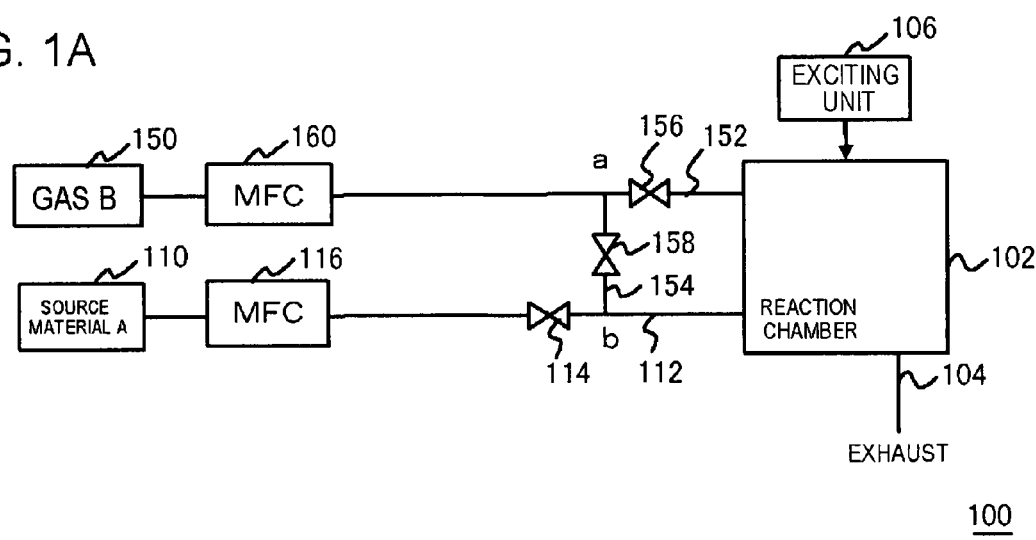
FIGS. 1A and 1B are block diagrams, illustrating configurations of deposition apparatuses in an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

In the following embodiments, a deposition apparatus may be configured that a film can be deposited via an ALD process, in which a gas containing a source material is supplied on a substrate, and the source material is adsorbed by an unit of one atomic layer. Further, in the following embodiments, the deposition apparatus may be a plasma deposition apparatus that is capable of conducting a PEALD process, in which at least one type of gas is excited to form a plasma and the excited gas is supplied to the substrate. For example, when the first gas and the second gas are employed, the deposition apparatus appropriately conduct: an operation for forming a deposition layer by supplying the first gas on a substrate within the reaction chamber without being excited, where the first gas is adsorbed thereto; and an operation for treating the deposition layer, which is formed by adsorbing the first gas, by supplying the second gas in the reaction chamber while the second gas is excited to form a plasma. Here, the adsorption may be a chemical absorption.

In the following embodiments, when a deposition is performed using the first gas in the first operation, the second gas is supplied in the reaction chamber with the first gas as a carrier gas for the first gas. Having such procedure, the supply of the second gas in the reaction chamber can be ensured in both of the first operation and the second operation. Further, a flow rate of the second gas is suitably controlled to be sufficiently larger as compared with a flow rate of the first gas. For example, the flow rate of the first gas may be equal to or lower than about one-tenth of the flow rate of the second gas. Having such flow rate, a constant pressure of the second gas in the gas supply line can be maintained during supplying the first gas to the reaction chamber and during stopping the supply of the first gas. This configuration provides a constant flow rate of the supplied gas, thereby maintaining an improved deposition characteristics. In addition to above, the flow rate of the first gas may be equal to or larger than about one-thousandth of the flow rate of the second gas. Having such flow rate, an improved deposition by the first gas can be performed when the second gas is employed as a carrier gas for the first gas.

In the present embodiment, a material, which is capable of being adsorbed on a substrate even if the material is supplied alone without exciting into a plasma state, may be employed for the first gas. The first gas may be selected from a metallic material including an inorganic metallic compound such as metal halide and the like and an organic metallic material. In the present embodiment, a material, which is unreactive with the first gas under a condition of being plasma-excited, may be employed for the second gas. The second gas may be selected from, for example, nitrogen ($N_2$), hydrogen ($H_2$), ammonia ($NH_3$), or oxygen ($O_2$), or a gaseous mixture thereof. In addition, the second gas may further contain an inert gas such as argon (Ar), helium (He) or the like, in addition to the above-described gases. When $N_2$, $NH_3$ or $O_2$ is employed for the second gas, the second gas serves as a deposition gas by exciting the second gas into a plasma. This configuration can provide an improved throughput of the deposition process.

The first gas and the second gas may be selected from various materials that are commonly employed in the PEALD process. For example, when the second gas is $O_2$, the first gas may be composed of: an aluminum (Al) organometallic compound such as dimethyl aluminum hydride ($Al(CH_3)_2H$), trimethyl aluminum ($Al(CH_3)_3$) and the like; a tantalum (Ta) organometallic compound such as tantalum tetraethoxide dimethylamino-ethoxide (TATDMAE: $Ta(OC_2H_5)_4$ ($OC_2H_4N(CH_3)_2$), pentakis dimethylamino tantalum ($Ta(N(CH_3)_2)_5$), tertiary buthylimido tris (diethylamido) tantalum ($Ta(NC_4H_9)(N(C_2H_5)_2)_3$), tertiary amylimido tris (dimethylamido)tantalum ($Ta(NC(CH_3)_2C_2H_5)(N(CH_3)_2)_3$)) and the like; a strontium (Sr) organometallic compound such as bis dipivaloylmethanato strontium ($Sr(C_{11}H_{19}O_2)_2$) and the like; a titanium (Ti) organometallic compound such as tetrakis dimethylamino titanium ($Ti(N(CH_3)_2)_4$), tetra propoxy titanium (titanium tetraisopropoxide, $Ti(OC_3H_7)_4$) and the like; a barium (Ba) organometallic compound such as bis dipivaloylmethanato barium ($Ba(C_{11}H_{19}O_2)_2$) and the like; a bismuth (Bi) organometallic compound such as bismuth tris tert-amyloxide ($Bi(OC(CH_3)_2C_2H_5)_3$), tris dipivaloylmethanato bismuth ($Bi(C_{11}H_{19}O_2)_3$) and the like; a lead (Pb) organometallic compound such as bis dipivaloylmethanato lead ($Pb(C_{11}H_{19}O_2)_2$) and the like; a zirconium (Zr) organometallic compound such as tetra butoxy zirconium ($Zr(OC_4H_9)_4$), tetra dipivaloylmethanato zirconium ($Zr(C_{11}H_{19}O_2)_4$), tetra diethylamino zirconium ($Zr(N(C_2H_5)_2)_4$) and the like; a hafnium (Hf) organometallic compound such as tetra butoxy hafnium ($Hf(OC_4H_9)_4$), tetra dimethylamide hafnium ($Hf(N(CH_3)_2)_4$) and the like; a ruthenium (Ru) organometallic compound such as bis ethyl cyclopentadienyl ruthenium (Ru (($C_2H_5$) ($C_5H_4$))$_2$) and the like; and an organic silicon compound such as tetraethyl ortho silicate ($Si(OC_2H_5)_4$) and the like. An use of such materials can provide forming a metallic oxide film with an oxygen plasma.

In addition, for example, when the second gas is $H_2$, the first gas may be composed of: an Al organometallic compound such as dimethyl aluminum hydride ($Al(CH_3)_2H$), trimethyl aluminum ($Al(CH_3)_3$) and the like; a Ta organometallic compound such as pentakis dimethylamino tantalum ($Ta(N(CH_3)_2)_5$), tertiary buthylimido tris (diethylamido) tantalum (TBTDET) (Ta ($NC_4H_9$) ($N(C_2H_5)_2)_3$), tertiary amylimido tris (dimethylamido) tantalum ($Ta(NC(CH_3)_2C_2H_5)$ ($N(CH_3)_2)_3$)) and the like; a Ta halide such as tantalum pentachloride ($TaCl_5$) and the like; a Ti organometallic compound such as tetra dimethylamino titanium ($Ti(N(CH_3)_2)_4$) and the like; a Ti halide such as titanium tetrachloride ($TiCl_4$) and the like; a Zr organometallic compound such as tetra diethylamino zirconium ($Zr(N(C_2H_5)_2)_4$) and the like; a Hf organometallic compound such as tetra dimethylamide hafnium ($Hf(N(CH_3)_2)_4$) and the like; a Ru organometallic compound such as bis ethyl cyclopentadienyl ruthenium (Ru (($C_2H_5$) ($C_5H_4$))$_2$) and the like; a silicon (Si) halide such as dichlorosilane ($H_2SiCl_2$) and the like; and a tungsten (W) halide such as tungsten hexafluoride ($WF_6$) and the like. An use of such materials can provide forming a metallic film or a metallic nitride film with a hydrogen plasma.

In addition, for example, when the second gas is a gaseous mixture of $N_2$ and $H_2$, or $NH_3$, the first gas may be composed of:

an Al organometallic compound such as dimethyl aluminum hydride ($Al(CH_3)_2H$), trimethyl aluminum ($Al(CH_3)_3$) and the like; a Ta organometallic compound such as tantalum tetraethoxide dimethylamino-ethoxide (TATDMAE: $Ta(OC_2H_5)_4(OC_2H_4N(CH_3)_2)$), tantalum ethoxide ($Ta(OC_2H_5)_5$), pentakis dimethylamino tantalum ($Ta(N(CH_3)_2)_5$), tertiary buthylimido tris (diethylamido) tantalum ($Ta(NC_4H_9)$ ($N(C_2H_5)_2)_3$), tertiary amylimido tris (dimethylamido) tantalum ($Ta(NC(CH_3)_2C_2H_5)$ ($N(CH_3)_2)_3$)) and the like; a Sr organometallic compound such as bis dipivaloylmethanato strontium ($Sr(C_{11}H_{19}O_2)_2$) and the like; a Ti organometallic compound such as tetrakis dimethylamino titanium ($Ti(N(CH_3)_2)_4$), tetra propoxy titanium (titanium tetraisopropoxide, $Ti(OC_3H_7)_4$) and the like; a Ba organometallic compound such as bis dipivaloylmethanato barium $(Ba(C_{11}H_{19}O_2)_2)$ and the like; a Bi organometallic compound such as bismuth tris tert-amyloxide $(Bi(OC(CH_3)_2 C_2H_5)_3)$, tris dipivaloylmethanato bismuth $(Bi(C_{11}H_{19}O_2)_3)$ and the like; a Pb organometallic compound such as bis dipivaloylmethanato lead $(Pb(C_{11}H_{19}O_2)_2)$ and the like; a Zr organometallic compound such as tetra butoxy zirconium $(Zr(OC_4H_9)_4)$, tetra dipivaloylmethanato zirconium $(Zr(C_{11}H_{19}O_2)_4)$, tetra diethylamino zirconium $(Zr(N(C_2H_5)_2)_4)$ and the like; a Hf organometallic compound such as tetra butoxy hafnium $(Hf(OC_4H_9)_4)$, tetra dimethylamide hafnium $(Hf(N(CH_3)_2)_4)$ and the like; a Ru organometallic compound such as bis ethyl cyclopentadienyl ruthenium $(Ru((C_2H_5)(C_5H_4))_2)$ and the like; and an organic silicon compound such as tetraethyl ortho silicate $(Si(OC_2H_5)_4)$ and the like. An use of such materials can provides forming a metallic nitride film or a metallic nitride oxide film with a plasma of the gaseous mixture.

First Embodiment

FIG. 1A is a diagram, illustrating a configuration of a deposition apparatus in the present embodiment. A deposition apparatus 100 includes: a reaction chamber 102 for depositing a film; an exciting unit 106 for exciting a gas to form a plasma; a first source material supplying unit 110 for supplying a first source material A; a first gas supply line 112; a gas supplying unit 150 for supplying a gas B (second gas); and a second gas supply line 152. The first source material A may be a gaseous material at an ambient temperature, or alternatively may be solid or liquid material at an ambient temperature. The deposition apparatus 100 may be configured that a first source material A can be vaporized and supplied into a reaction chamber 102 in the apparatus, even if the first source material A is liquid or solid material at an ambient temperature. A gas of the first source material A corresponds to the first gas described above.

The first gas supply line 112 and the second gas supply line 152 are connected to the reaction chamber 102 and communicate with the reaction chamber 102, respectively. The first gas supply line 112 is provided with a first mass flow controller (MFC) 116 that is capable of controlling a flow rate of the first source material A from the first source material supplying unit 110. The gas supplying unit 150 is provided with a second MFC 160 that is capable of controlling a flow rate of gas B from the gas supplying unit 150. The second gas supply line 152 includes a first branched line 154 connected to the first gas supply line 112.

A second valve 156 (switching unit) is provided between a branchpoint "a" in the second gas supply line 152 for the first branched line 154 and the reaction chamber 102. The first branched line 154 is provided with a third valve 158. The second valve 156 and the third valve 158 may be configured to be a pair of switching valves that are capable of complementary opening and closing. Operations of the second valve 156 and the third valve 158 (switching unit) can provide a complementary switching between a supply of the gas B directly into the reaction chamber 102, and a supply of the gas B through the first gas supply line 112.

In addition, in alternative exemplary implementations, the second valve 156 and the third valve 158 may be configured to include a three-way valve, which provides a complementary switching between a condition of communicating directly with the reaction chamber 102 and a condition of communicating with the first branched line 154. Such three-way valve may be disposed at a branchpoint "a" in the second gas supply line 152 for the first branched line 154

The first valve 114 (switching unit) that is capable of conducting and stopping a supply of the first source material A to the reaction chamber 102 is provided between a connecting point "b" with the first branched line 154 in the first gas supply line 112 and the first MFC 116. The first valve 114 may be a switching valve, which operates an opening and a closing thereof with synchronizing an operation of the third valve 158. More specifically, when the third valve 158 is closed and the gas B is not introduced into the first gas supply line 112, the first valve 114 is closed.

Figure 8A:
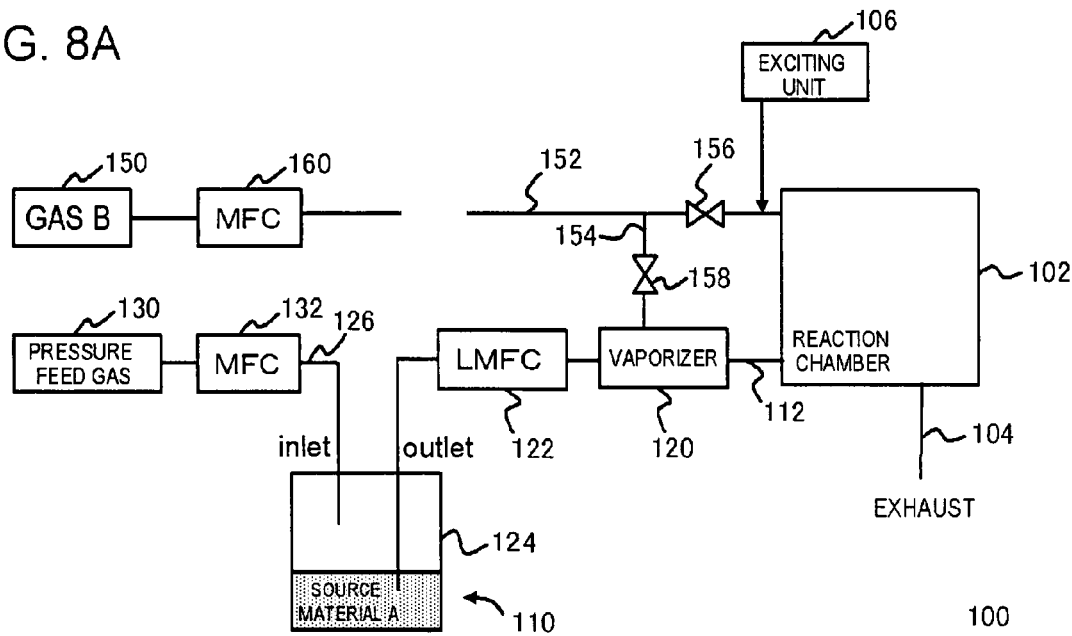
FIGS. 8A and 8B are block diagrams, illustrating other configurations of deposition apparatuses in an embodiment of the present invention.
Figure 8B:
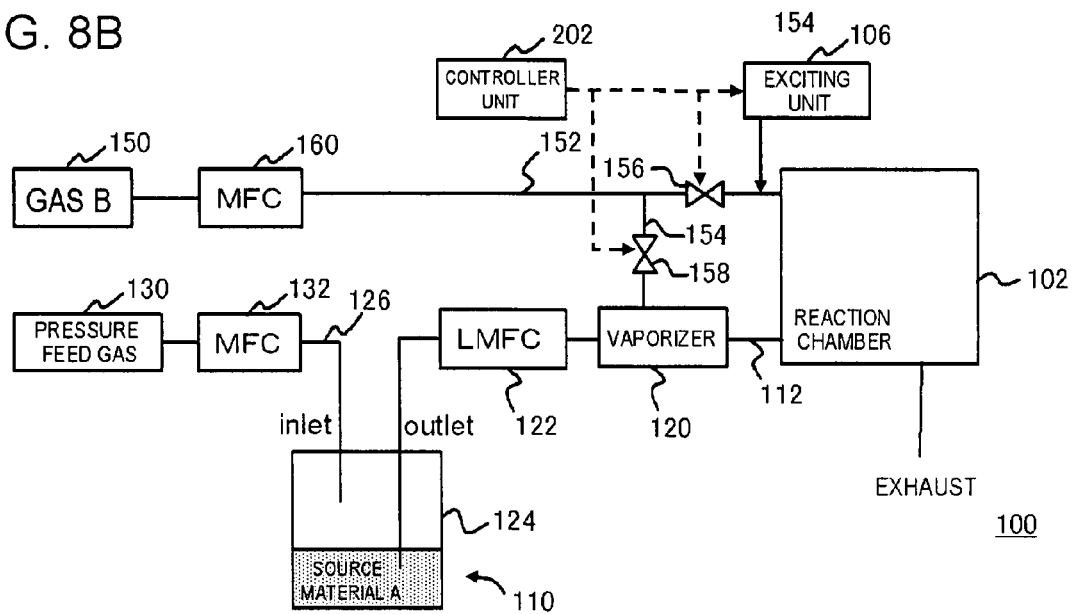

The exciting unit 106 induces an excitation of the gas B supplied from the second gas supply line 152. In the present embodiment, the exciting unit 106 may be configured of achieving a plasma-excitation in the reaction chamber 102, or alternatively, as shown in FIG. 8, may be configured of being a remote plasma source provided at a location in vicinity of a connection between the second gas supply line 152 and the reaction chamber 102. Problems are caused in the conventional configuration described in Japanese Laid-open patent publication No. H10-284,487 that the configuration of causing a mixing of excited gases in a duct leads to a problem of easily causing a deposition of a film in the duct by a reaction of the gas, or that the configuration of having larger distance between a location for exciting the gas and the reaction chamber leads to a problem of reduced amount of the gas that maintains an excited state in the reaction chamber. Since the excited gas is not mixed in the duct according to the deposition apparatus 100 in the present embodiment, a clogging of the duct due to a deposition of a film from the gas on the internal wall of the duct is avoided. In addition, since the gas is excited in vicinity of the reaction chamber 102, larger amount of gas can be maintained to be excited within the reaction chamber. In the present embodiment, the reaction chamber 102 is provided with an exhaust line 104 that communicates with a vacuum pump or the like.

During the deposition using the deposition apparatus 100 in the present embodiment, the second MFC 160 controls the flow of the gas so that a substantially constant flow rate of the gas B flowing from the gas supplying unit 150 to the reaction chamber 102 is achieved. The first MFC 116 is also configured so as to provide a substantially constant flow rate of the first source material A.

Figure 1B:
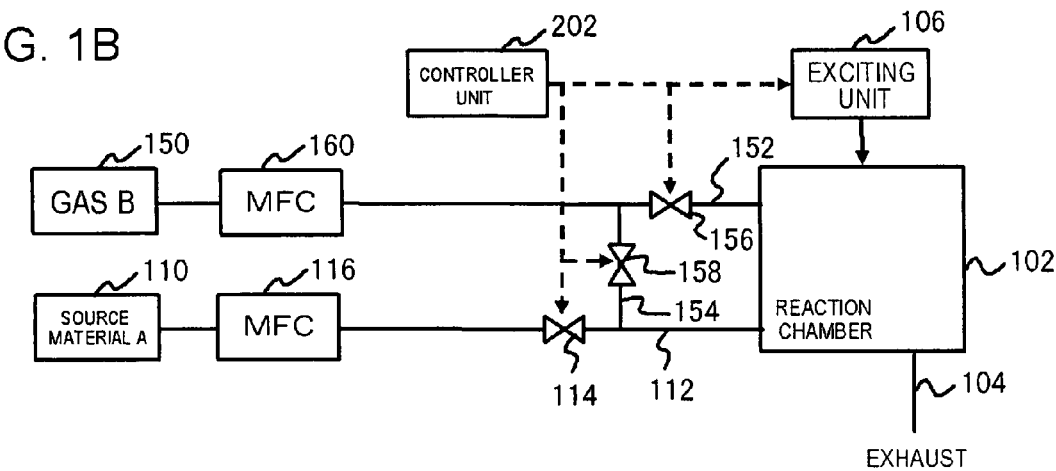

In addition, the deposition apparatus 100 may further include, as shown in FIG. 1B, a controller unit 202 for controlling the exciting unit 106, and for controlling a switching of the first valve 114, the second valve 156 and the third valve 158. The controller unit 202 executes a first controlling for supplying the first source material A with the gas B to the reaction chamber 102 without a plasma-excitation of the gas supplied into the reaction chamber 102, and a second controlling for inducing a plasma-excitation of the gas supplied into the reaction chamber 102 while preventing a supply of the first source material A into the reaction chamber 102, while the second MFC 160 maintains the flow rate of the gas B from the gas supplying unit 150 to the reaction chamber 102 to be substantially constant. More specifically, further description will be made as follows in reference to FIG. 2.

FIG. 2 is a timing chart, indicating a timing for opening or closing the third valve 158 and the second valve 156 and a timing for plasma-exciting (on) or not plasma-exciting (off) the gas supplied in the reaction chamber 102 by the exciting unit 106. The third valve 158 and the second valve 156 are complementarily opened and closed. The first valve 114 is opened and closed as synchronizing the operation of the third valve 158. More specifically, when the second valve 156 opens, the third valve 158 and the first valve 114 are closed, and when the second valve 156 is closed, the third valve 158 and the first valve 114 are opened. Having such configuration, the gas B supplied by the gas supplying unit 150 is supplied in the reaction chamber 102 directly from the second gas supply line 152, or through the first branched line 154 and the first gas supply line 112.

One cycle of this process is explained as follows. First of all, a plasma excitation is set to be off, and the second valve 156 is closed and the third valve 158 and the first valve 114 are opened (first step). This allows a supply of the first source material A and the gas B into the reaction chamber 102, thereby depositing the first source material A on the substrate. In addition, in such occasion, a substrate temperature in the reaction chamber 102 may be set to be a temperature, at which a reaction between the first source material A and the gas B is not induced. Under such condition, the gas supplied to the reaction chamber 102 is not plasma-excited, and therefore the gas B is not reactive with the first source material A and thus serves as a carrier gas for the first source material A.

In the next timing, the second valve 156 is opened and the third valve 158 and the first valve 114 are closed, while the status of the plasma excitation is maintained as off. Having such procedure, the gas B alone is selectively supplied in the reaction chamber 102. Therefore, the interior of the reaction chamber 102 is purged with the gas B, so that the first source material A remained in the reaction chamber 102 is discharged out of the reaction chamber 102.

Subsequently in the next timing, the status of the plasma excitation is switched on while the switching status of the valve between the open and the close is maintained (second step). Having such procedure, the gas B supplied into the reaction chamber 102 is excited to create a plasma, and the deposition layer formed by the adsorption of the first source material A is treated with the created plasma to produce a desired film. Here, the operations of one cycle process is completed. By repeating such operations, a film having a desired film thickness can be formed.

By the above described operations, the gas B may be supplied in the reaction chamber 102 as a carrier gas for the first source material A, even if the gas B is not plasma-excited. This constantly provides a supply of the gas B in the reaction chamber 102 in a steady basis. In addition, the flow rate of the first source material A is one or more orders of magnitude lower than the flow rate of the gas B in the present embodiment, and thus a pressure of a gaseous mixture of the gas B and the first source material A is influenced by the pressure of gas B. Therefore, a constant pressure can be maintained between the second MFC 160 and the reaction chamber 102 during depositing operations. This configuration provides a constant flow rate of the supplied gas, thereby maintaining an improved deposition characteristics. Further, since the first source material A and the gas B are supplied only in the reaction chamber 102, a consumption efficiency of the first source material A and the gas B can be improved. In addition, while the gas B is constantly supplied in the reaction chamber 102 and the first source material A is supplied, the first source material A is also introduced in the reaction chamber 102, and therefore a simultaneous exhaust of the first source material A and the gas B directly to the exhaust line 104 is avoided. Therefore, a clogging of the exhaust line 104 due to a reaction of these gases occurred in the exhaust line is also avoided. In addition, since no plasma excitation is caused for a gaseous mixture of the gas of the first source material A and the gas B, a deposition of a film in the duct from the gaseous mixture is also avoided. Further, since the exciting unit 106 is provided within or in vicinity of, the reaction chamber 102, the excited gases can be present in the reaction chamber 102 as they are still in the excited status.

The above described procedure is an example, and an appropriate modification according to the type of the source material may be implemented. For example, a purge with the gas B may not be performed. Alternatively, a purge may be performed after treating the deposition layer with the gas B and before conducting an adsorption of the first source material A in the next cycle. Alternatively, an operation involving a plasma excitation of the gas B after every predetermined cycles of the deposition with the first source material A may also be performed. In the configuration that the controller unit 202 controls the exciting unit 106, the first valve 114, the second valve 156 and the third valve 158 as shown in FIG. 1B, the controller unit 202 controls these unit/elements according to the timing chart shown in FIG. 2.

FIG. 3 is a diagram, illustrating a specific example of deposition apparatus 100 in the present embodiment. Here, a case that the first source material A is a liquid form at an ambient temperature will be described as an exemplary implementation. In addition, the gas B may be employed as a carrier gas for the gaseous first source material A, after vaporizing the first source material A.

Figure 3A:
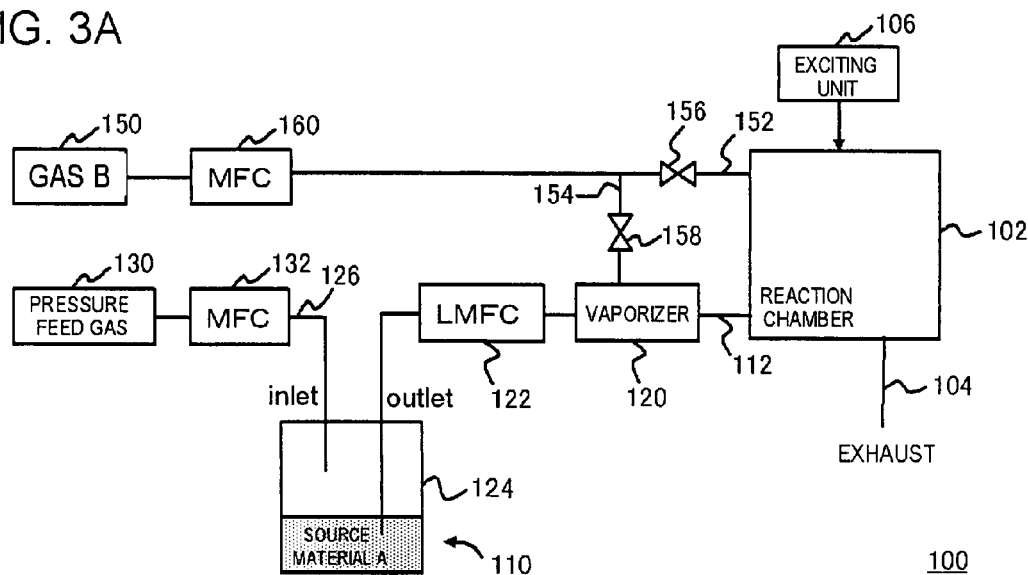
FIGS. 3A and 3B are block diagrams, illustrating other configurations of deposition apparatuses in an embodiment of the present invention.

As shown in FIG. 3A, a first source material supplying unit 110 includes: a first source material storage 124 for storing the first liquid source material A; a pressure feed gas supplying unit 130 for supplying a pressure feed gas; a third MFC 132 for controlling a flow rate of the pressure feed gas; and a pressure feed gas supply line 126 for supplying the pressure feed gas to the first source material storage 124.

The first gas supply line 112 is introduced into the liquid source material A stored in the first source material storage 124. The first gas supply line 112 is provided with a liquid mass flow controller (LMFC) 122 for controlling a flow rate of the first source material A and a vaporizer 120 for vaporizing the liquid first source material A. Here, the vaporizer 120 includes a flow rate controlling unit for controlling the flow rate of the vaporized gas. The LMFC 122 and the vaporizer 120 corresponds to the first MFC 116 and the first valve 114 shown in FIG. 1A, respectively.

The first source material A is pressure-fed in the vaporizer 120 with an aid of the pressure feed gas, and is vaporized at the vaporizer 120, and then is supplied in the reaction chamber 102. Here, when the second valve 156 is opened, the third valve 158 and the vaporizer 120 are closed, and when the second valve 156 is closed, the third valve 158 and the vaporizer 120 are opened.

Figure 3B:
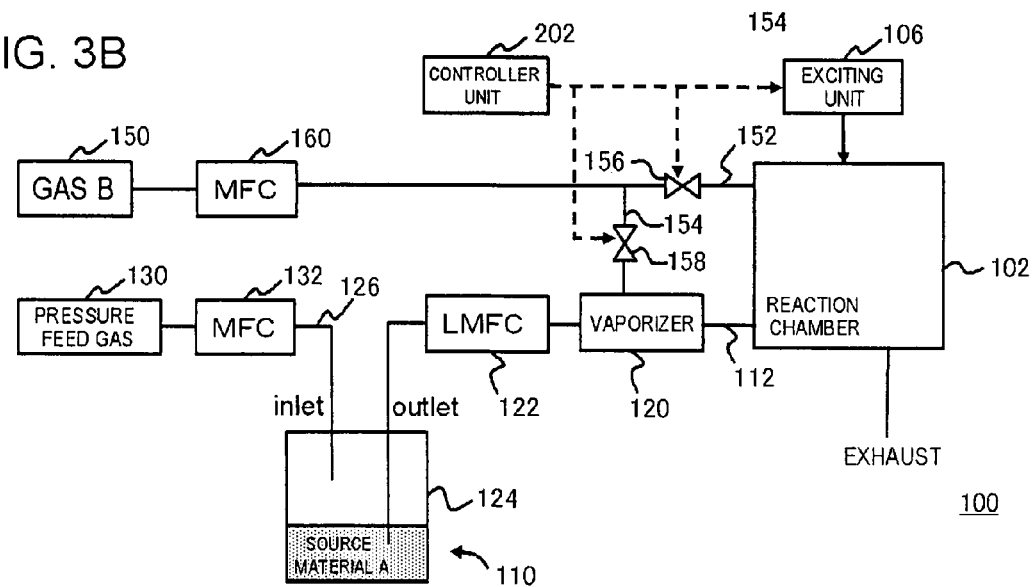

FIG. 3B, is a diagram, illustrating a configuration of a deposition apparatus that is the same as the deposition apparatus 100 shown in FIG. 3A, except that the deposition apparatus further includes a controller unit 202. The controller unit 202 provides controls for the second valve 156, the third valve 158, the vaporizer 120 and the exciting unit 106. The controller unit 202 conducts a controlling that is similar to what described above in reference to FIG. 2.

Even in such case, the flow rate of the first source material A vaporized by the vaporizer 120 may be set to be sufficiently lower than the flow rate of the gas B. Having such flow rate, even if the gaseous mixture of the first source material A and the gas B is supplied in the reaction chamber 102 through the first gas supply line 112, the pressure therein may be substantially equivalent to the pressure in the case that only the gas B is supplied in the reaction chamber 102 from the second gas supply line 152. This achieves that the gas B is constantly supplied into the reaction chamber 102 at a flow rate that corresponds to the value of the second MFC 160. Therefore, a depositing operation can be performed without changing a pressure between the second MFC 160 and the reaction chamber 102. This provides a deposition of a film with an improved accuracy.

Further, since the first source material A and the gas B, which are supplied from the first source material supplying unit 110 and the gas supplying unit 150, respectively, are all supplied to the reaction chamber 102, a consumption efficiency of the first source material A and the gas B can be improved.

Figure 4:
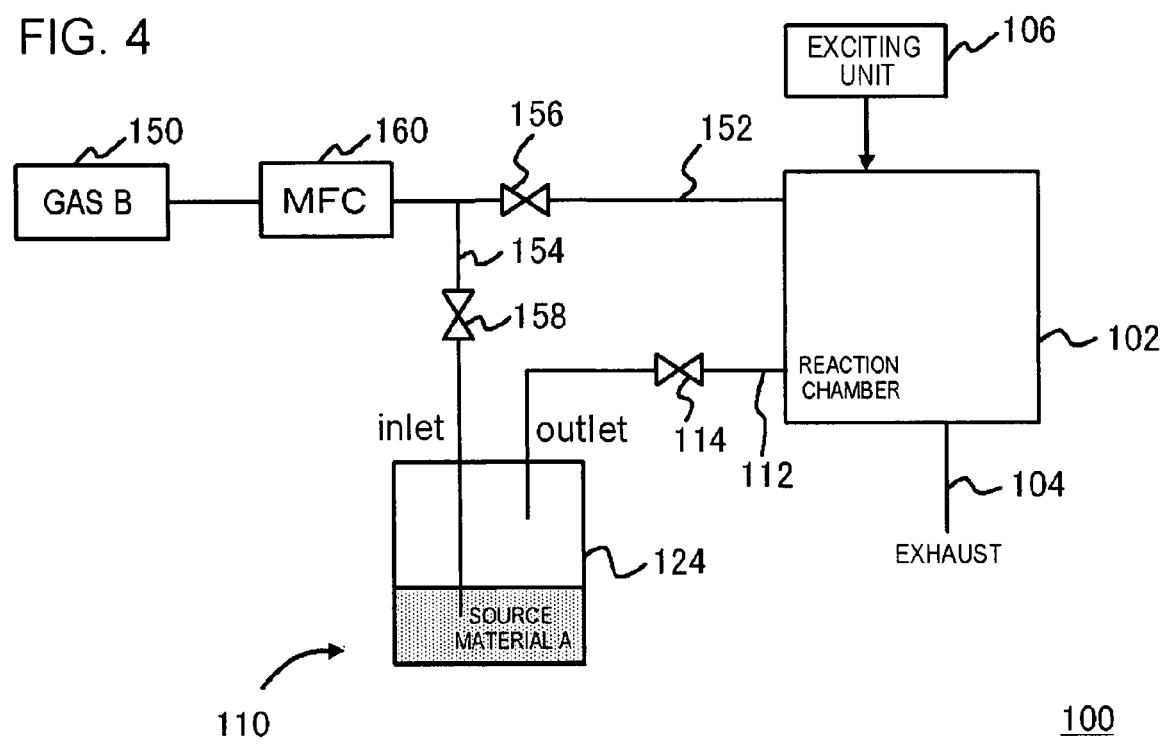
FIG. 4 is a block diagram, illustrating other configuration of a deposition apparatus in an embodiment of the present invention.

FIG. 4 is a diagram, illustrating another exemplary implementation of a deposition apparatus 100 in the present embodiment. Also in the present configuration, a case that the first source material A is a liquid form at an ambient temperature will be described as an exemplary implementation. The gas B serves as a pressure feed gas that vaporizes the first source material A and transfers the vaporized thereof and as a carrier gas.

The first source material supplying unit 110 includes a first source material storage 124. The first branched line 154 that branched off from the second gas supply line 152 is introduced within the source material A stored in the first source material storage 124. The first gas supply line 112 connects the first source material storage 124 to the reaction chamber 102. While it is shown in FIG. 4 that the tip of the first branched line 154 is disposed more deeply than the tip of the first gas supply line 112 in the first source material storage 124, a length and a diameter of the duct, a geometry of the duct may alternatively be appropriately optimized according to the type of the first source material A, and for example, another relationship in the length of the lines, in which the tip of the first gas supply line 112 is deeper than the tip of the first branched line 154, may be employed. In addition, while it is shown in FIG. 4 that the geometry of the source material storage includes the cross section of a cylinder, the geometry thereof may be appropriately optimized according to the type of the source material A, and for example, the bottom of the cylinder may have a gradient to form a mortar-shaped bottom.

The deposition apparatus 100 shown in FIG. 4 may be configured to have a controller unit 202, similarly as the apparatus shown in FIG. 1B. In this case, the controller unit 202 provides controls for the second valve 156, the third valve 158, the first valve 114, and the exciting unit 106.

Figure 5:
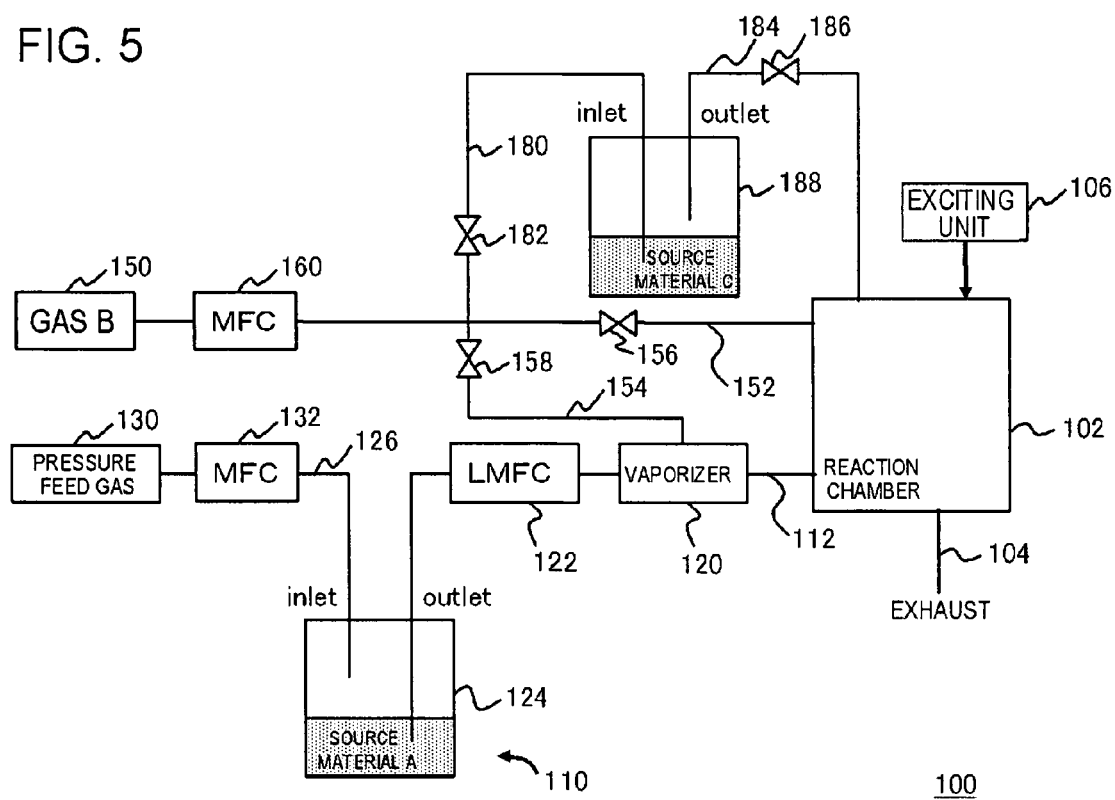
FIG. 5 is a block diagram, illustrating other configuration of a deposition apparatus in an embodiment of the present invention.

FIG. 5 is a diagram, illustrating another exemplary implementation of a deposition apparatus 100 in the present embodiment. In this case, a configuration of employing the first source material A and the second source material C as source materials for depositing films will be illustrated. In addition, a case that the first source material A and the second source material C are in liquid form at an ambient temperature will be described as an exemplary implementation. The second source material C may be composed of a material similar to what has been illustrated as materials of the first source material A.

The deposition apparatus 100 further includes, in addition to the configuration shown in FIG. 3A, a second branched line 180, a fifth valve 182, a fifth source gas supply line 184, a sixth valve 186 and a second source material storage 188. The second source material storage 188 stores the second liquid source material C. The second branched line 180 branches off from the second gas supply line 152, and serves as supplying the gas B to the second source material storage 188. The fifth valve 182 opens and shuts a communication between the gas supplying unit 150 and the second branched line 180. The fifth source gas supply line 184 provides a connection of the second source material storage 188 with the reaction chamber 102. The sixth valve 186 is provided on the fifth source gas supply line 184, and opens and shuts a communication between the source material storage 188 and the reaction chamber 102.

Here, the second valve 156, the third valve 158 and the fifth valve 182 are controlled so that any one of the valves is opened, and the rest are closed. This allows that the gas B supplied from the gas supplying unit 150 is constantly supplied into the reaction chamber 102, and therefore a constant flow rate can be maintained. In addition, an improved utilization efficiency of the gas and the source materials can be achieved.

Second Embodiment

Figure 6:
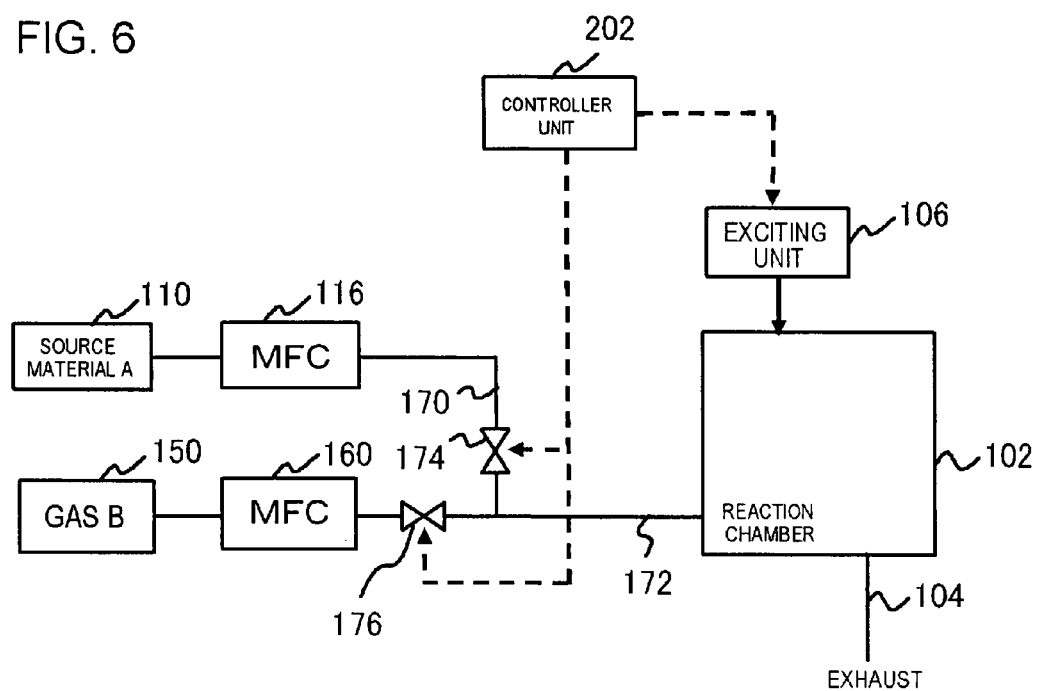
FIG. 6 is a block diagram, illustrating a configuration of a deposition apparatus in an embodiment of the present invention.

FIG. 6 is a diagram, illustrating an exemplary implementation of a configuration of a deposition apparatus in the present embodiment. The deposition apparatus 100 includes a reaction chamber 102, an exhaust line 104, an exciting unit 106, a first source material supplying unit 110, a first MFC 116, a gas supplying unit 150, a second MFC 160, a third source gas supply line 170, a fourth source gas supply line 172, a valve 174 (switching unit), a valve 176 (switching unit) and a controller unit 202.

The fourth source gas supply line 172 is connected to the reaction chamber 102 to supply the gas B to the reaction chamber 102. The valve 176 is provided in the fourth source gas supply line 172, and serves as implementing and stopping a supply of the gas B to the reaction chamber 102. In the present embodiment, the valve 176 is constantly opened during the depositing operation, and the gas B is continually supplied in reaction chamber 102. The third source gas supply line 170 is connected to the fourth source gas supply line 172 to supply first source material A thereto. The valve 174 is provided in the third source gas supply line 170, and serves as implementing and stopping a supply of the first source material to the reaction chamber 102.

Figure 7:
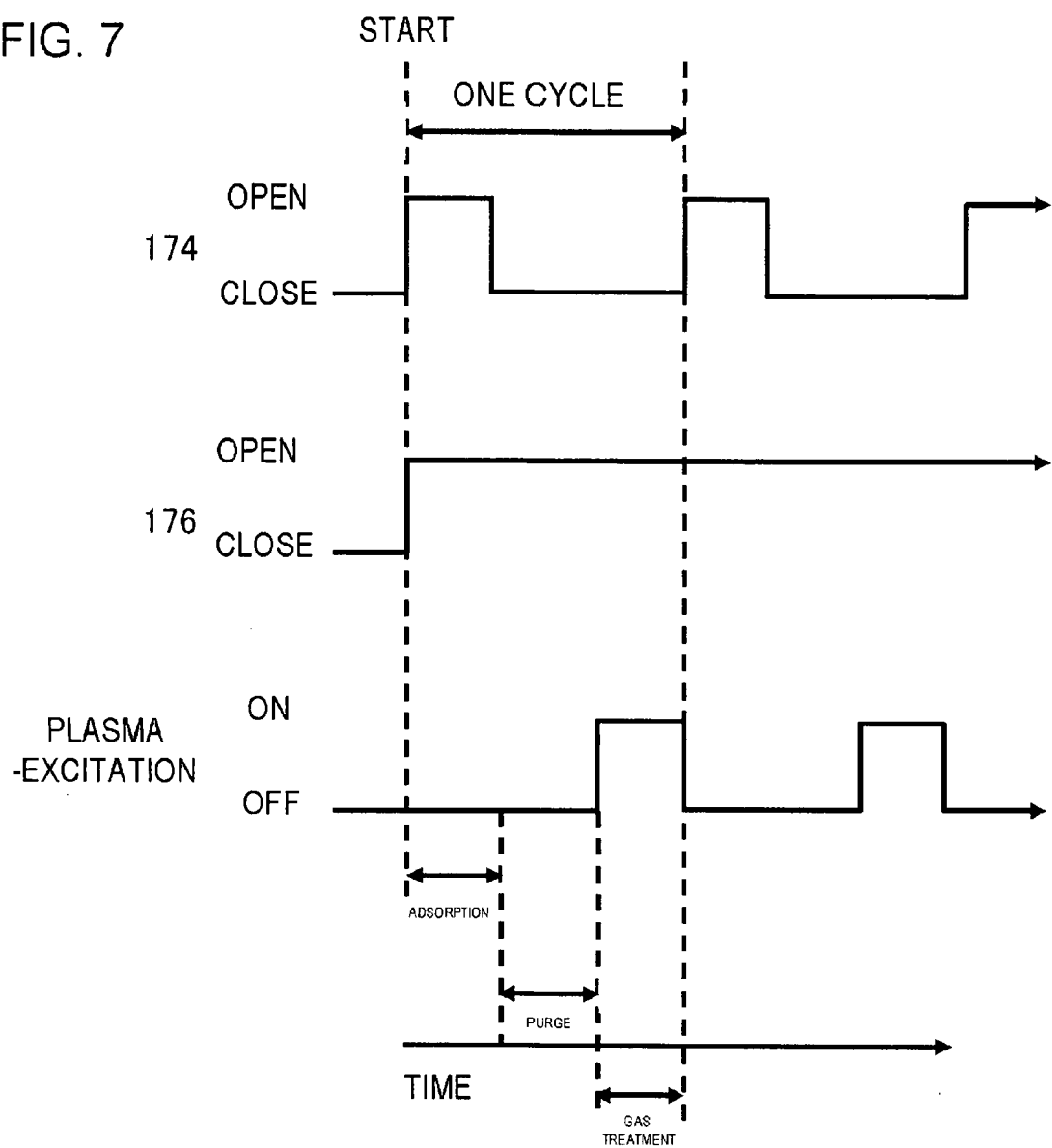
FIG. 7 is a timing chart, indicating a controlling timing for the deposition apparatus in the embodiment of the present invention.

The controller unit 202 provides controls for the valve 174, the valve 176 and the exciting unit 106. FIG. 7 is a timing chart in the present embodiment, indicating a timing for opening or closing the fourth valve 174 and the valve 176 and a timing for plasma-exciting (on) or not plasma-exciting (off) the gas supplied in the reaction chamber 102 by the exciting unit 106.

One cycle of this process is explained as follows. First of all, a plasma excitation is set to be off, and the valve 176 and the fourth valve 174 are opened (first step). This allows a supply of the first source material A and the gas B into the reaction chamber 102, thereby depositing the first source material A on the substrate. Under such condition, the gas supplied to the reaction chamber 102 is not plasma-excited, and therefore the gas B is not reactive with the first source material A and thus serves as a carrier gas for the first source material A.

In the next timing, the fourth valve 174 is closed, while the status of the plasma excitation is maintained as off. Having such procedure, the gas B alone is selectively supplied in the reaction chamber 102. Therefore, the interior of the reaction chamber 102 is purged with the gas B, so that the first source material A remained in the reaction chamber 102 is discharged out of the reaction chamber 102.

Subsequently in the next timing, the status of the plasma excitation is switched on while the switching status of the valve between the open and the close is maintained (second step). Having such procedure, the gas B supplied into the reaction chamber 102 is excited to create a plasma, and the deposition layer formed by the adsorption of the first source material A is treated with the created plasma to produce a desired film. Here, the one process cycle is completed. By repeating such process cycles, a film having a desired film thickness can be formed.

The controller unit 202 determines on which stage operation is performed according to the timing shown in FIG. 7, such that the switching of the valve 174 and the valve 176 between the open and the close and the on/off of the exciting unit 106 are controlled. In the present embodiment, the controller unit 202 controls the valves, so that the valve 176 is opened when a depositing operation is started and thereafter the gas B is continually supplied in the reaction chamber 102.

In the deposition apparatus 100 in the present embodiment, the gas B is constantly supplied in reaction chamber 102. Therefore, a constant pressure can be maintained between the second MFC 160 and the reaction chamber 102 during serial depositing operations. In addition, an improved utilization efficiency of the gas and the source materials can be achieved.

According to the deposition apparatus 100 of the present embodiment, a plasma excitation by the exciting unit 106 is not performed when the first source material A is supplied. Therefore, a deposition of a film from the gaseous mixture that is formed by mixing the gas of the first source material A and the excited gas B in the fourth source gas supply line 172 is avoided. Further, in the present embodiment, the exciting unit 106 may be configured of generating a plasma-excitation in the reaction chamber 102. Having such configuration, larger amount of gas can be maintained to be excited within the reaction chamber. In addition, a clogging of the duct due to a deposition of a film from the gas on the internal wall of the duct is avoided.

It is to be understood that the invention is capable of using in various other combinations, modifications and environments, and any other interchanges in the expression between the method and device or the like according to the present invention may be effective as an alternative of an embodiment according to the present invention.

In addition, the deposition apparatus 100 may be configured of additionally including valves other than that shown in the diagrams as required. Further, suitable geometries and/or positions of the gas supply lines (ducts), the source material storages (containers) or the like may also be appropriately selected.

While the deposition apparatus 100 configured to include the controller unit 202 has been described in the second embodiment, the method according to the present invention may be implemented by a deposition apparatus 100 that does not include the controller unit 202. In this case, the switching of the valves between the open and the close and on/off of the exciting unit may also be performed according to the timing shown in FIG. 7. In addition, in method of the present invention, the deposition apparatus 100 may be configured to have no valve 176 so that the gas B can be continually supplied during the deposition process.

While the deposition apparatus 100 configured to be dedicated to conduct a deposition by the ALD process has been illustrated in the above-mentioned embodiments, the deposition apparatus 100 may be configured to be dedicated to conduct a deposition by a CVD process or the like other than the ALD process. In the above-mentioned embodiment, the exemplary implementation of utilizing the gas B that functions as a carrier gas when the gas of the first source material A is adsorbed onto the substrate has been described. Alternatively, a film may be deposited by a thermal CVD process from the gas of the first source material A and the gas B, and the deposited film may further be treated with the plasma-excited gas B. In this case, a temperature in the duct may be appropriately controlled so as to avoid inducing a reaction between the gas of the first source material A and the gas B in the duct.

It is apparent that the present invention is not limited to the above embodiment, and may be modified and changed without departing from the scope and spirit of the invention.

What is claimed is:

1. A deposition apparatus, comprising:
    a reaction chamber for deposition;
    a gas supplying system for supplying a first gas and a second gas into said reaction chamber, comprising:
        a first supply line being connected at a first point to said reaction chamber for supplying said first gas in said reaction chamber;
        a second supply line, including a first line connected to said reaction chamber at a second point for supplying said second gas into said reaction chamber and a second line branched from said first line and connected to said first supply line;
    a switching unit for switching between a supply of said first gas to said reaction chamber in a first step in which said first gas and said second gas are supplied into said reaction chamber and a stopping of the supply of said first gas to said reaction chamber in a second step in which said second gas is selectively supplied into said reaction chamber, comprising:
        a first valve located on said first supply line between the supply of said first gas and the second line's connection to said first supply line;
        a second valve located on said second supply line between the branched second line and said reaction chamber; and
        a third valve located on said second line between said first supply line and said second supply line;
    an exciting unit for exciting a gas being supplied into said reaction chamber to create a plasma;
    a controller unit configured to control:
        said exciting unit, so that an excitation of the gas into a plasma is not performed by said exciting unit during said first step in which said first gas is adsorbed on a substrate to form a deposition layer while having said second gas being employed as a carrier gas and an excitation of the gas into a plasma is performed by said exciting unit during said second step in which said second gas, with being excited into a plasma, treats said deposition layer; and
        said switching unit to switch between the supply of said first gas to said reaction chamber in said first step in which said first gas and said second gas are supplied into said reaction chamber and stopping the supply of said first gas to said reaction chamber in said second step in which said second gas is selectively supplied into said reaction chamber, wherein said second gas is selectively supplied into said reaction chamber by closing said first valve and supplying said second gas via said first supply line by closing the second valve and opening the third valve and supplying the second gas via the first line of the second supply line by opening the second valve and closing the third valve.

2. The deposition apparatus according to claim 1, further comprising:
    a flow rate controlling unit for controlling a flow rate of said second gas, so that a flow rate of said second gas supplied into said reaction chamber is substantially constant in both of a first stage and in said second step.

3. The deposition apparatus according to claim 2, wherein said flow rate controlling unit controls the flow rate of said second gas, so that a flow rate of said first gas supplied into said reaction chamber is equal to or lower than one-tenth of the flow rate of said second gas.

4. The deposition apparatus according to claim 1, wherein said switching unit includes a first switching unit and a second switching unit, said first switching unit being capable of supplying said second gas to said second line in said first step and of supplying said second gas to said first line in said second step, and said second switching unit being capable of supplying said first gas into said reaction chamber in said first step, and being capable of stopping the supply of said first gas into said reaction chamber in said second step.

5. The deposition apparatus according to claim 1, wherein said second gas is selected from a group including: nitrogen ($N_2$); ammonia ($NH_3$); oxygen ($O_2$); hydrogen ($H_2$); a gaseous mixture thereof; and a gaseous mixture thereof with argon (Ar) or helium (He).

6. The deposition apparatus according to claim 1, wherein said first supply line connected at an opposite distal end to only a first gas supply.

7. The deposition apparatus according to claim 6, wherein said second supply line connected at an opposite distal end to only a second gas supply.

8. A deposition apparatus, comprising:
a reaction chamber for conducting a deposition process;
a first supply line being connected at a first point to said reaction chamber for supplying a first gas into said reaction chamber;
a second supply line including a first line connected at a second point to said reaction chamber for supplying a second gas into said reaction chamber and a second line branched from said first line and connected to said first supply line;
a switching unit, configured to switch between a first step and a second step, wherein, in said first step, said second gas is supplied to said second line and eventually supplied into said reaction chamber with said first gas, and wherein, in said second step, the supply of said first gas is stopped and said second gas is selectively supplied to said first supply line, comprising:
a first valve located on said first supply line between the supply of said first gas and the second line's connection to said first supply line;
a second valve located on said second supply line between the branched second line and said reaction chamber;
a third valve located on said second line between said first supply line and said second supply line;
an exciting unit for exciting the gas supplied from said first line of said second supply line into a plasma;
a controller unit configured to control:
said exciting unit, so that an excitation of the gas into a plasma is not performed by said exciting unit during said first step in which said first gas is adsorbed on the a substrate to form a deposition layer while having said second gas being employed as a carrier gas and an excitation of the gas into a plasma is performed by said exciting unit during said second step in which said second gas, with being excited into a plasma, treats said deposition layer, and
said switching unit to switch between said first step and said second step, wherein said second gas is selectively supplied to said first supply line by closing said first valve and supplying said second gas via said first supply line by closing the second valve and opening the third valve.

9. The deposition apparatus according to claim 8, wherein said first supply line connected at an opposite distal end to only a first gas supply.

10. The deposition apparatus according to claim 9, wherein said second supply line connected at an opposite distal end to only a second gas supply.

* * * * *